(12) United States Patent
Rinner

(10) Patent No.: US 11,239,406 B2
(45) Date of Patent: Feb. 1, 2022

(54) COMPONENT FOR PRODUCING ACTIVE HAPTIC FEEDBACK

(71) Applicant: EPCOS AG, Munich (DE)

(72) Inventor: Franz Rinner, Deutschlandsberg (AT)

(73) Assignee: EPCOS AG, Munich (DE)

( * ) Notice: Subject to any disclaimer, the term of this patent is extended or adjusted under 35 U.S.C. 154(b) by 740 days.

(21) Appl. No.: 15/766,796

(22) PCT Filed: Sep. 1, 2016

(86) PCT No.: PCT/EP2016/070638
§ 371 (c)(1),
(2) Date: Apr. 6, 2018

(87) PCT Pub. No.: WO2017/060011
PCT Pub. Date: Apr. 13, 2017

(65) Prior Publication Data
US 2019/0067552 A1 Feb. 28, 2019

(30) Foreign Application Priority Data
Oct. 9, 2015 (DE) .......................... 102015117262.3

(51) Int. Cl.
*H01L 41/083* (2006.01)
*H01L 41/047* (2006.01)
(Continued)

(52) U.S. Cl.
CPC .............. *H01L 41/083* (2013.01); *G08B 6/00* (2013.01); *H01L 41/042* (2013.01);
(Continued)

(58) Field of Classification Search
CPC ............... H01L 41/083; H01L 41/0471; H01L 41/0477; H01L 41/053; H01L 41/0825; H01L 41/1876; G08B 6/00
See application file for complete search history.

(56) References Cited

U.S. PATENT DOCUMENTS 5,729,077 A * 3/1998 Newnham .............. H02N 2/043
310/328
5,982,304 A 11/1999 Selker et al.
(Continued)

FOREIGN PATENT DOCUMENTS

CN 1398044 A 2/2003
CN 101341605 A 1/2009
(Continued)

OTHER PUBLICATIONS

Janocha, Hartmut, "Intelligente" und Self-sensing-Aktoren. In: Unkonventionelle Aktoren: eine Einführung. 2., ergänzte und aktualisierte Auflage. München: Oldenbourg-Verl., 2013. Titelseite + S. 7-10.—ISBN 978-3-486-71886-7.
(Continued)

*Primary Examiner* — Bryan P Gordon
(74) *Attorney, Agent, or Firm* — Morgan, Lewis & Bockius LLP

(57) ABSTRACT

The present invention relates to a component (1) for generating active haptic feedback, comprising a main body (2) having first and second internal electrodes (3, 4) stacked one above another in a stacking direction (S), wherein a respective piezoelectric layer (9) is arranged between the internal electrodes (3, 4), wherein the component (1) is configured to identify a force exerted on the component (1), wherein the component (1) is configured to generate active haptic feedback if a force exerted on the component (1) is identified, and wherein the haptic feedback is generated by virtue of an electrical voltage being applied between the first and second internal electrodes (3, 4), said electrical voltage resulting in a change in length of the main body (2).

11 Claims, 3 Drawing Sheets

Figure 1:
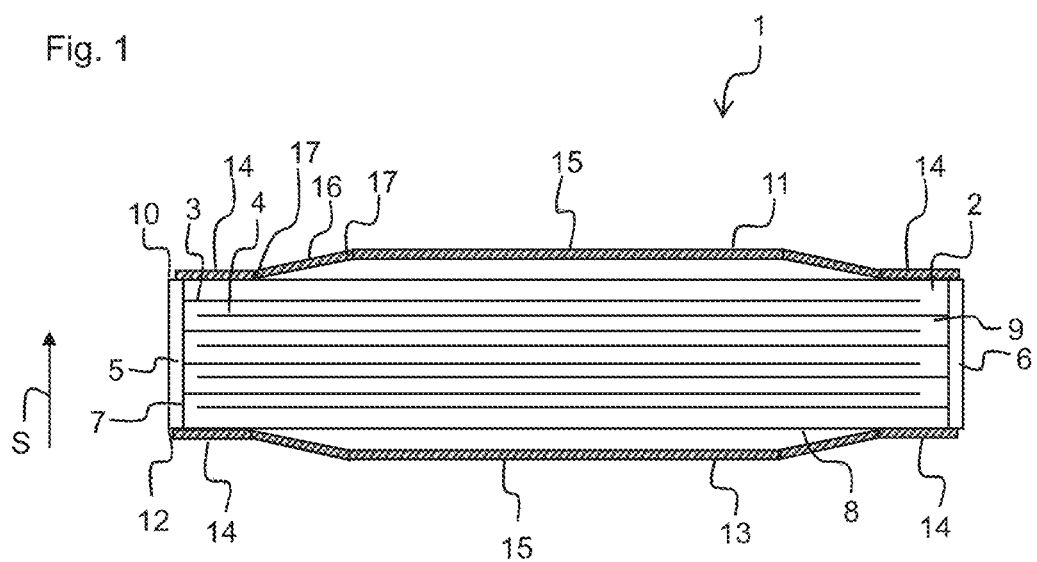

(51) Int. Cl.
*H01L 41/053* (2006.01)
*H01L 41/08* (2006.01)
*H03K 17/96* (2006.01)
*G08B 6/00* (2006.01)
*H01L 41/04* (2006.01)
*H01L 41/187* (2006.01)

(52) U.S. Cl.
CPC ...... *H01L 41/0471* (2013.01); *H01L 41/0477* (2013.01); *H01L 41/053* (2013.01); *H01L 41/0825* (2013.01); *H01L 41/0833* (2013.01); *H01L 41/1876* (2013.01); *H03K 17/964* (2013.01); *H01H 2215/052* (2013.01); *H03K 2217/96062* (2013.01)

(56) References Cited

U.S. PATENT DOCUMENTS

| | | | |
|---|---|---|---|
| 2006/0028095 A1* | 2/2006 | Maruyama | H03K 17/9643 310/316.01 |
| 2007/0096594 A1 | 5/2007 | Maruyama et al. | |
| 2009/0145533 A1 | 6/2009 | Karayianni et al. | |
| 2011/0310055 A1* | 12/2011 | An | H01L 41/0825 345/174 |
| 2012/0075198 A1 | 3/2012 | Sulem et al. | |
| 2012/0274599 A1 | 11/2012 | Schediwy | |
| 2013/0278681 A1* | 10/2013 | Saito | H02N 2/163 347/68 |
| 2013/0342081 A1* | 12/2013 | Kuroda | H01G 4/30 310/366 |
| 2015/0209564 A1 | 7/2015 | Lewin et al. | |
| 2016/0027988 A1* | 1/2016 | Nagahata | B41J 2/1646 347/70 |
| 2016/0050498 A1* | 2/2016 | Ogata | H04R 17/10 381/190 |

FOREIGN PATENT DOCUMENTS

| | | |
|---|---|---|
| CN | 102195514 A | 9/2011 |
| CN | 102576250 A | 7/2012 |
| CN | 102918671 A | 2/2013 |
| CN | 103003970 A | 3/2013 |
| CN | 104218846 A | 12/2014 |
| CN | 204167367 U | 2/2015 |
| DE | 102007045089 A1 | 3/2009 |
| DE | 102011117709 A1 | 5/2013 |
| EP | 1543568 B1 | 8/2007 |
| EP | 2434555 A1 | 3/2012 |
| JP | 2000502210 | 2/2000 |
| JP | 2005352927 A | 12/2005 |
| JP | 2006048302 | 2/2006 |
| JP | 2011175518 A | 9/2011 |
| JP | 2013012148 | 1/2013 |
| JP | 2014509117 A | 4/2014 |
| JP | 5669985 B2 | 2/2015 |
| KR | 20110075714 A | 7/2011 |
| KR | 20110138629 A | 12/2011 |
| RU | 2028715 C1 | 2/1995 |
| RU | 2009135057 A | 3/2011 |
| RU | 2461865 C2 | 9/2012 |
| WO | WO-97022154 A1 | 6/1997 |
| WO | WO-2011022319 A1 | 2/2011 |

OTHER PUBLICATIONS

Dogan, Aydin, et al., Composite Piezoelectric Transducer with Truncated Conical Endcaps "Cymbal", IEEE Transactions on Ultrasonics, Ferroelectrics, and Frequencey Control, vol. 44, No. 3, May 1997, pp. 597-605.

Kim, Hyeoung Woo, et al., "Energy Harvesting Using a Piezoelectric "Cymbal" Transducer in Dynamic Environment", Japanese Journal of Applied Physics, vol. 43, No. 9R, Sep. 2004.

* cited by examiner

COMPONENT FOR PRODUCING ACTIVE HAPTIC FEEDBACK

The present invention relates to a component for generating active haptic feedback. This is a component which is configured to generate feedback to a user when the latter exerts a force on the component. Such a component may be used for example in a button, e.g. in an actuating button for instruments. The component may generate the active haptic feedback for example in order to inform a user that settings made by said user are successfully implemented by the component.

Elements for generating active haptic feedback are known for example from vibration alarms in cellular phones. The latter comprise motors having an unbalance. However, they result in non-uniform feedback and furthermore have a comparatively high structural height.

Therefore, it is an object of the present invention to specify an improved component for generating active haptic feedback.

This object is achieved by means of a component according to the present claim 1.

What is proposed is a component for generating active haptic feedback, which comprises a main body having first and second internal electrodes stacked one above another in a stacking direction, wherein a respective piezoelectric layer is arranged between the internal electrodes, wherein the component is configured to identify a force exerted on the component and to generate active haptic feedback if a force exerted on the component is identified, wherein the haptic feedback is generated by virtue of an electrical voltage being applied between the first and second internal electrodes, said electrical voltage resulting in a change in length of the main body.

The feedback is referred to as active feedback since it is generated by the component itself. The feedback is referred to as haptic feedback since a user can perceive it via his/her sense of touch.

The change in length of the main body can be, in particular, a change in length in a direction perpendicular to the stacking direction. Such a change in length is also referred to as transverse contraction. The change in the length in the direction perpendicular to the stacking direction can occur on account of the piezoelectric effect that arises in the piezoelectric layers as a result of the voltage applied between the first and second internal electrodes.

The component can furthermore be configured to convert the change in length of the main body in a direction perpendicular to the stacking direction into a change in length of the component in the stacking direction. Particularly the change in length of the component in the stacking direction can be perceived as active haptic feedback by a user.

By virtue of the fact that the active haptic feedback is generated by means of a voltage applied between the first and second internal electrodes, the component offers many degrees of freedom in the configuration of the active haptic feedback. The latter can be varied by the duration for which a voltage is applied being varied or by the magnitude of an applied voltage being varied or by intervals in which no voltage is present alternating with intervals in which voltage is present. In this way, it is possible to define different types of feedback for different events.

The first and second internal electrodes can differ to the effect that they are contacted with different external electrodes of the component and that a voltage can accordingly be applied between them.

The piezoelectric layer can be a lead zirconate titanate ceramic (PZT ceramic). The piezoelectric layers can be polarized such that the change in length of the main body is brought about as a result of the application of an AC voltage between the first and second internal electrodes and the piezoelectric effect associated therewith. The PZT ceramic can furthermore additionally contain Nd and Ni. Alternatively, the PZT ceramic can furthermore additionally comprise Nd, K and, if appropriate, Cu. Alternatively, the piezoelectric layers can comprise a composition containing $Pb(Zr_xTi_{1-x})O_3 + y\ Pb(Mn_{1/3}Nb_{2/3})O_3$.

The main body can be a sintered part comprising the internal electrodes and the piezoelectric layers.

A frustoconical metal sheet can be arranged on a top side and/or an underside of the component. The metal sheet can be configured to transform a change in length of the main body in a direction perpendicular to the stacking direction into a change in length of the component in the stacking direction. The metal sheet can serve to amplify a change in length of the main body in the stacking direction which occurs on account of a transverse contraction of the main body. For this purpose, the metal sheet can be shaped in such a way that a considerable raising or lowering of a central region of the metal sheet occurs in the event of contraction or extension of the edge regions of the metal sheet. The metal sheet can contribute to converting the transverse contraction of the main body into a considerable change in length in the stacking direction of the component.

The frustoconical metal sheet can comprise an edge region secured on the top side and/or respectively the underside of the component. The edge region can be secured to the main body of the component for example by means of adhesive bonding, soldering or welding. The metal sheet can furthermore comprise a central region projecting from the top side and/or respectively the underside of the main body in the stacking direction. The distance between the central region of the metal sheet and the top side and/or respectively the underside can vary considerably if the main body experiences a transverse contraction on account of a voltage applied between the internal electrodes.

The metal sheet can comprise titanium or consist of titanium. Titanium has major advantages particularly for the present application here of the component for generating active haptic feedback. The component can be used as a button, for example, wherein active haptic feedback is intended to be generated if a user presses the button. If such a button is actuated by a human being, then it is almost unavoidable that moisture, for example in the form of finger perspiration, will be left on the button. This can lead to corrosion. However, titanium is a material particularly resistant to corrosion, with the result that it can protect the component well against long-term damage resulting from corrosion.

Furthermore, titanium has a high mechanical loading capacity, with the result that it can lengthen the lifetime of the component.

Moreover, titanium has a coefficient of thermal expansion which is very close to the coefficient of thermal expansion of the main body. As a result, the location where the metal sheet is connected to the main body is not subjected to significant mechanical loading in the event of a change in temperature. By way of example, both the metal sheet and the main body can have a coefficient of thermal expansion of between 8 and 9 ppm/K. Furthermore the component can comprise a measuring unit for measuring a voltage which is generated between the first and second internal electrodes and which arises on account of a force exerted on the main body, wherein the component is configured to identify the force exerted on the component on the basis of the values detected by the measuring unit. The first and second internal electrodes can accordingly perform a dual function in the component. They can firstly serve to identify a force exerted on the component, since a voltage is generated between them in this case, and secondly initiate the change in length of the component, by means of which the active haptic feedback is generated, if an AC voltage is applied between them.

Alternatively or supplementarily, the component can comprise a third internal electrode, which is connected to a measurement contact. The third internal electrode is not electrically contacted with a first external electrode, to which the first internal electrodes are connected, or with a second external electrode, to which the second internal electrodes are connected.

The component can be configured to measure a voltage which is generated between the third internal electrode and one of the first internal electrodes and which arises on account of a force exerted on the main body, wherein the component is configured to identify the force exerted on the component on the basis of the measured voltage. Said one of the first internal electrodes can be directly adjacent to the third internal electrode.

The use of a separate third internal electrode that is not used for generating a change in length of the main body, but rather serves merely to identify the voltage exerted on the component, can be advantageous in order to achieve a higher sensitivity. By way of example, the distance between the third internal electrode and the first internal electrode adjacent to it can be greater than the distances between the mutually adjacent first and second internal electrodes. Accordingly, a higher voltage is present between the third electrode and the adjacent first internal electrode for the same mechanical force such that a threshold for detecting a force is reduced.

The third internal electrode can be arranged centrally in the stacking direction in a stack of first and second internal electrodes. Such a construction is symmetrical. As a result, the third internal electrode cannot result in disturbances of the component and the functioning of the component is not impaired.

Alternatively, the third internal electrode can be arranged in the main body in such a way that all first and second internal electrodes are arranged on one side of the third internal electrode. This construction ensures that the third internal electrode is adjacent only to one further internal electrode. Accordingly, that region of the component which cannot actively be used for generating the transverse contraction is reduced.

The main body can comprise a hole extending in a stacking direction from an underside of the main body to a top side of the main body and cutting out a central region of the main body. In this way, it is possible to reduce the capacitance between the first and second internal electrodes, thereby enabling the component to be operated with a lower power.

The main body can comprise a base surface arranged perpendicularly to the stacking direction, said base surface being round. In comparison with a square base surface, in this case the corner regions have as it were been cut off. This can also serve to reduce the capacitance of the main body. If the capacitance of the main body is reduced, then a lower power is required to operate the component.

The main body can comprise a base surface arranged perpendicularly to the stacking direction, the side length of said base surface being between 10 and 30 mm, wherein the main body can have a height of between 0.5 and 2.0 mm in the stacking direction.

The internal electrodes can comprise copper or consist of copper.

In accordance with a further aspect, the present invention relates to an arrangement comprising a plurality of components as described above which are stacked one above another. In this case, the components are stacked one above another in the stacking direction. The changes in length of the components in the stacking direction together add up here, with the result that stronger feedback can be generated overall with the arrangement since the change in length of the arrangement is greater by a multiple than the change in length of an individual component. The central regions of the metal sheets respectively arranged on a top side and an underside of the components are fixedly connected to one another in this case.

The present invention is described in greater detail below with reference to the figures.

Figure 2:
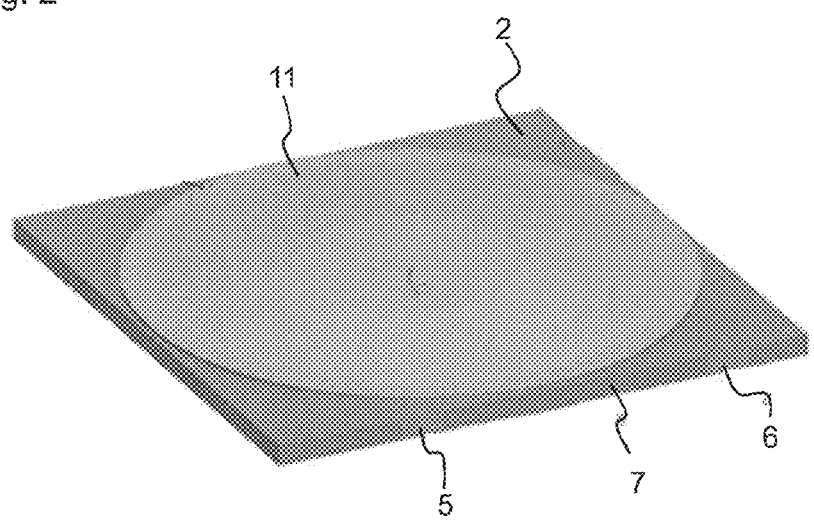
Figure 3:
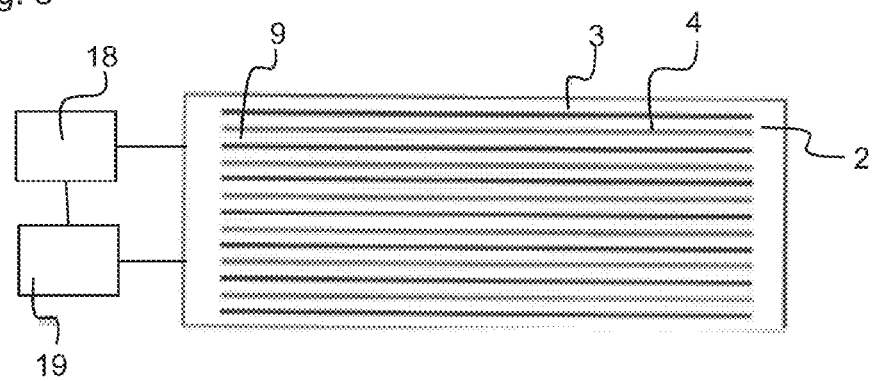
Figure 4:
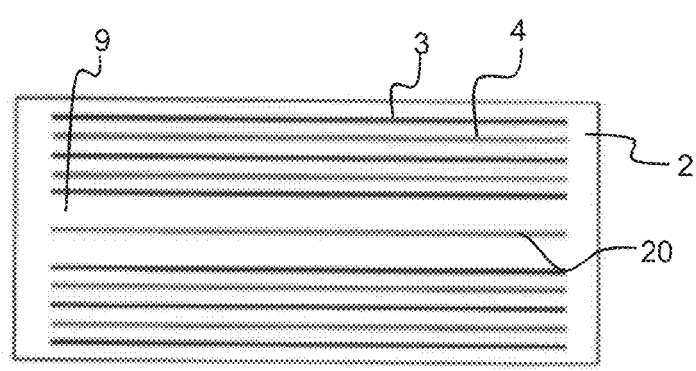
Figure 5:
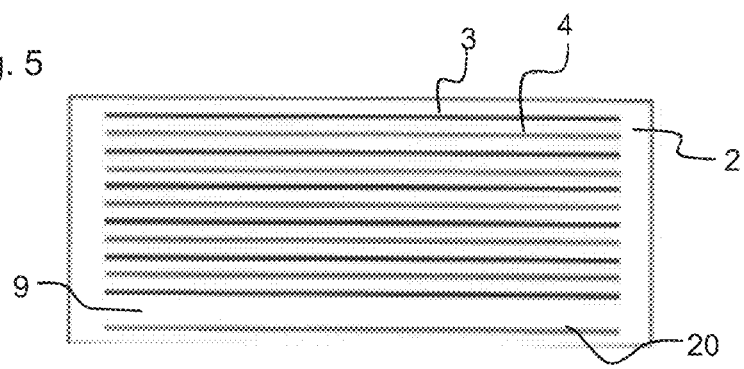
Figure 6:
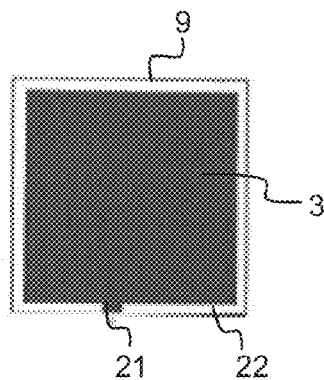
Figure 7:
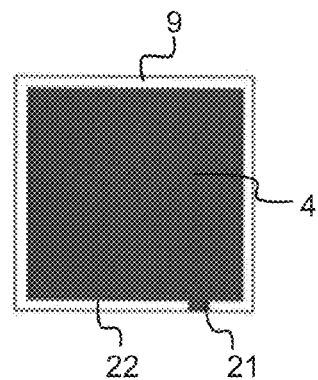
Figure 8:
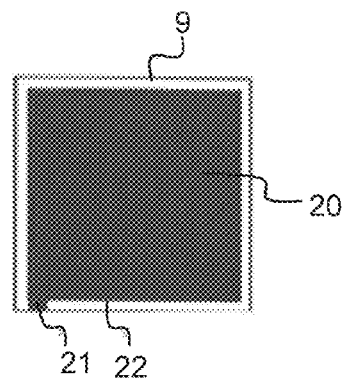
Figure 9:
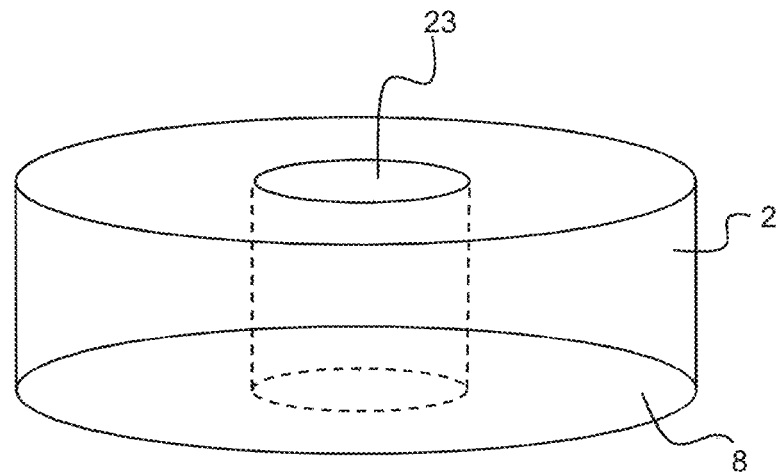

FIG. 1 shows a cross section through a component for generating active haptic feedback in accordance with a first exemplary embodiment, FIG. 2 shows a perspective view of a component, FIG. 3 shows a cross section through the main body of the component, FIG. 4 shows a cross section through the main body of a component in accordance with a second exemplary embodiment, FIG. 5 shows a cross section through a main body of a component in accordance with a third exemplary embodiment, FIG. 6 shows a piezoelectric layer printed with a first internal electrode, FIG. 7 shows a piezoelectric layer printed with a second internal electrode, FIG. 8 shows a piezoelectric layer printed with a third internal electrode, FIG. 9 shows the main body of a component in accordance with a fourth exemplary embodiment.

FIG. 1 shows a cross section through a component 1 for generating active haptic feedback. FIG. 2 shows the component 1 in an alternative embodiment in a perspective view.

The component 1 comprises a main body 2 having first internal electrodes 3 and second internal electrodes 4 stacked one above another in a stacking direction S. The first internal electrodes 3 are contacted with a first external electrode 5. The second internal electrodes 4 are contacted with a second external electrode 6. The first and second external electrodes 5, 6 are respectively arranged on a side surface 7 of the main body 2, the surface normal with respect to said side surface extending perpendicularly to the stacking direction S. In the case of the component 1 shown in FIG. 1, the first and second external electrodes 5, 6 are arranged on opposite side surfaces 7. In the case of the component 1 shown in FIG. 2, the first and second external electrodes 5, 6 are arranged on the same side surface 7.

The main body 2 has a small height in the stacking direction S. Furthermore, the main body 2 comprises a base surface 8, the surface normal in respect of which is parallel to the stacking direction S. The extent of the base surface 8 is significantly larger than the height of the main body 2. This results in a flat and wide main body 2. By way of example, the maximum extent of the main body 2 in a direction perpendicular to the stacking direction S can be at least ten times the magnitude of the height of the main body 2 in the stacking direction S. Preferably, the extent of the main body 2 in a direction perpendicular to the stacking direction S is at least twenty times the magnitude of the height of the main body 2 in stacking direction S.

Furthermore, the main body 2 comprises piezoelectric layers 9, which consist of a piezoelectric material, e.g. of a PZT ceramic. The piezoelectric layers 9 are arranged between the first and second internal electrodes 3, 4. The piezoelectric layers 9 are polarized in such a way that the application of an electrical voltage between the first and second internal electrodes 3, 4 results in a transverse contraction of the main body 2, in the case of which the length of the main body 2 changes perpendicularly to the stacking direction S.

The transverse contraction necessarily also results in a change in length of the main body 2 in the stacking direction S. Said change in the length in the stacking direction S can be perceived as active haptic feedback by a user of the component 1.

In order to further amplify the effect of the change in length in the stacking direction S, an upper frustoconical metal sheet 11 is arranged on a top side 10 of the component 1. Furthermore, a lower frustoconical metal sheet 13 is arranged on the underside 12 of the component 1. The top side 10 and the underside 11 are opposite one another in the stacking direction S. The surface normals with respect to the top side 10 and the underside 11 are parallel to the stacking direction S.

The metal sheets 11, 13 each comprise an edge region 14 that is fixedly connected to the main body 2. Furthermore, the metal sheets 11, 13 each comprise a central region 15. The central region 15 of the upper metal sheet 11 projects from the top side 10 of the main body 2 and accordingly does not touch said top side. The central region 15 of the lower metal sheet 13 projects from the underside 12 of the main body 2 and accordingly likewise does not touch said underside. The distance between the central region 15 of the upper metal sheet 11 and the top side 10 is 0.5 mm in a state in which no force is exerted on the component 1 and no voltage is present between the first and second internal electrodes 3, 4. The distance between the central region 15 of the lower metal sheet 13 and the underside 12 is also 0.5 mm in this state.

The central region 15 of the upper metal sheet 11 is connected to the edge region 14 of the upper metal sheet 11 via a connecting region 16. The connecting region 16 comprises two bending points 17, at which the upper metal sheet is deformed to a particularly great extent if the edge region 14 is subjected to contraction or expansion. The lower metal sheet 13 is constructed in the same way.

If a voltage is then applied between the first and second internal electrodes 3, 4, which voltage results in a transverse contraction of the main body 2, the edge regions 14 of the metal sheets 11, 13 are in each case radially contracted since the latter are fixedly connected to the main body 2. Consequently, the central regions 15 of the frustoconical metal sheets 11, 13 are raised in the stacking direction, wherein the metal sheets 11, 13 are bent in particular at the two bending points 17. In this case, the central region 15 of the upper metal sheet 11 is moved in the stacking direction oppositely to the central region 15 of the lower metal sheet 13. As a result, the change in length of the component 1 in the stacking direction S is increased since the central regions 15 move away from one another.

If the polarity of the voltage present between the first and second internal electrodes 3, 4 is then reversed, the edge regions of the metal sheets 11, 13 are in each case radially moved away from one another. As a result, the two central regions 15 of the metal sheets 11, 13 are moved toward one another.

In this way, the transverse contraction of the main body 2 can be transformed into a change in length of the main body 2 in the stacking direction. By way of example, a component 1 having a height of less than 2.5 mm in this way can experience a deflection of approximately 100 µm in the stacking direction S. It would not be possible to achieve a change in length in the stacking direction S of this magnitude with a component 1 of this height solely on the basis of a piezoelectric effect acting directly in the stacking direction S.

FIG. 3 shows a simplified cross section through the main body 2 of the component 1 in accordance with the first exemplary embodiment. The first and second internal electrodes 3, 4 arranged in the main body 2 are depicted in FIG. 3. Said internal electrodes are stacked one above another alternately in the stacking direction S.

The component 1 is configured to identify a force acting on the component 1. The component 1 can be embodied as a button, for example, which can be pressed by a user. In this case, the user exerts a force on the top side 10 of the component 1. The component 1 is deformed as a result. In particular, the component 1 is thereby compressed in the stacking direction S. As a consequence, an electrical voltage arises in the piezoelectric layers 9. Said electrical voltage is then present between the first and second internal electrodes 3, 4.

The component 1 is furthermore interconnected with a measuring unit 18 and a control unit 19. These are indicated schematically in FIG. 3. The measuring unit 18 measures the voltage present between the first and second internal electrodes 3, 4. The control unit 19 is configured to apply an AC voltage between the first and second internal electrodes 3, 4.

If no force is exerted on the component 1, then no voltage is present between the first and second internal electrodes 3, 4. However, if a user presses on the component 1, an electrical voltage arises, which is then present between the first and second internal electrodes 3, 4. The voltage between the first and second internal electrodes 3, 4 is constantly measured by the measuring unit 18. If the measuring unit 18 then identifies a rise in the voltage, an actuation of the button can be deduced.

If the voltage between the first and second internal electrodes 3, 4 exceeds a predefined threshold value, the control unit 19 can instigate the generation of active haptic feedback. For this purpose, the control unit 19 applies an AC voltage between the first and second internal electrodes 3, 4. On account of the piezoelectric effect, the AC voltage results in a transverse contraction of the component 1 and an associated change in length in the stacking direction S, which is perceived as feedback.

The measuring unit 18 can furthermore be configured to identify the magnitude of the force exerted on the component 1. To that end, in the measuring unit 18, a plurality of threshold values for the voltage generated between the first and second internal electrodes 3, 4 can be defined and a check is made in each case to ascertain which of said threshold values are exceeded. The control unit 19 can furthermore be configured to instigate the generation of feedback, the exact configuration of which depends on the magnitude of the exerted. In this case, the magnitude and duration of the applied AC voltage can be varied.

FIG. 4 shows a cross section through a main body 2 of a component 1 in accordance with a second exemplary embodiment. The component 1 comprises a third internal electrode 20. The third internal electrode 20 is connected neither to the first external electrode 5 nor to the second external electrode 6. Instead, the third internal electrode 20 is connected to an additional measurement contact (not shown), which is likewise arranged on the side surface 7 of the main body 2. The third internal electrode 20 serves to identify a force exerted on the main body 2. For this purpose, the voltage present between the third internal electrode 20 and the two first internal electrodes 3 adjacent thereto is monitored by the measuring unit 18. If a force is exerted on the main body 2, a voltage arises between said internal electrodes 3, 20.

The third internal electrode 20 is arranged centrally in a stack of first and second internal electrodes 3, 4. The component 1 has a symmetrical construction. The distance between the third internal electrode 20 and the first internal electrode 3 adjacent thereto is greater than the distances between the mutually adjacent first and second internal electrodes 3, 4. On account of the greater distance, a voltage that arises between the third internal electrode 20 and the first internal electrodes 3 adjacent thereto is higher than that between a first and a second internal electrode 3, 4 adjacent thereto if a force is exerted on the component 1. As a result, the measurement sensitivity can be increased since even small forces can be sufficient to generate voltages that can be identified by the measuring unit 18.

FIG. 5 shows the main body 2 of a component 1 in accordance with a third exemplary embodiment. The third exemplary embodiment differs from the second exemplary embodiment in the arrangement of the third internal electrode 20. The third internal electrode 20 here is the internal electrode that is arranged closest to the underside 12 of the main body 2. The stack comprises only one piezoelectric layer 9 having an increased thickness, such that overall the height of the stack can be reduced, or such that more internal electrodes can be arranged in the component 1 for the same stack height.

However, the component 1 is now constructed non-symmetrically. If an electrical voltage is applied between the first and second internal electrodes 3, 4, bending of the component 1 can occur on account of the piezoelectric effect.

FIGS. 6 to 8 each show a print depiction of a piezoelectric layer 9. FIG. 6 shows a piezoelectric layer 9 on which a first internal electrode 3 is printed. FIG. 7 shows a piezoelectric layer 9 on which a second internal electrode 4 is printed. FIG. 8 shows a piezoelectric layer 9 on which a third internal electrode 20 is arranged.

Each internal electrode comprises a contact web 21, via which the internal electrode is electrically contacted with one of the external electrodes 5, 6 or with the measurement contact. The first internal electrode 3, the second internal electrode 4 and the third internal electrode 20 differ in the arrangement of the respective contact webs 21.

Apart from the respective contact web 21, the internal electrodes 3, 4, 20 are set back from the side surfaces of the main body 2. Accordingly, isolation zones 22 are arranged here. The isolation zones 22 experience no transverse contraction when an AC voltage is applied between the first and second internal electrodes 3, 4. As a result, mechanical stresses can occur in the component 1, these also being referred to as the clamping effect. As a result of these mechanical stresses, the change in length of the component 1 in the stacking direction S can be reduced and damage to the component 1 can occur. Therefore, the isolation zones 22 have a small width in order to minimize this effect.

FIG. 9 shows a main body 2 from a component 1 in accordance with a fourth exemplary embodiment in a perspective view. The main body 2 comprises a hole 23 extending in the stacking direction from the underside 12 of the main body 2 to the top side 10 of the main body. The hole 23 thus cuts out a central region of the main body 2. The areas and thus the capacitance between the first and second internal electrodes 3, 4 are reduced in this way.

The main body 2 furthermore comprises a round base surface 8 arranged perpendicularly to the stacking direction S.

LIST OF REFERENCE SIGNS

1 Component
2 Main body
3 First internal electrode
4 Second internal electrode
5 First external electrode
6 Second external electrode
7 Side surface
8 Base surface
9 Piezoelectric layer
10 Top side
11 Upper frustoconical metal sheet
12 Underside
13 Lower frustoconical metal sheet
14 Edge region
15 Central region
16 Connecting region
17 Bending point
18 Measuring unit
19 Control unit
20 Third internal electrode
21 Contact web
22 Isolation zone
23 Hole
S Stacking direction

The invention claimed is:

1. A component for generating an active haptic feedback, comprising:
   a main body having first and second internal electrodes stacked one above another in a stacking direction, wherein a respective piezoelectric layer is arranged between the first and second internal electrodes,
   wherein the component is configured to identify a force exerted on the component, and generate, in response to identification of the force exerted on the component, the active haptic feedback,
   wherein the active haptic feedback is generated by virtue of an electrical voltage being applied between the first and second internal electrodes, said electrical voltage resulting in a change in length of the main body,
   wherein a metal sheet comprising titanium is arranged on a top side and/or an underside of the main body, and is configured to transform the change in length of the main body in a direction perpendicular to the stacking direction into the change in length of the component in the stacking direction,
   wherein the component comprises a measuring unit for measuring a voltage which is generated between the first and second internal electrodes and which arises on account of the force exerted on the component,
   wherein the component is configured to identify the force exerted on the component on a basis of the measured voltage, wherein the component comprises a first external electrode and a second external electrode, and
wherein the first internal electrodes are contacted with the first external electrode, and the second internal electrodes are contacted with the second external electrode.

2. The component according to claim 1,
wherein the metal sheet has a frustoconical shape.

3. The component according to claim 1,
wherein a third internal electrode is arranged centrally in the stacking direction in a stack of the first and second internal electrodes.

4. The component according to claim 1,
wherein a third internal electrode is arranged in the main body in such a way that the first and second internal electrodes are arranged on one side of the third internal electrode.

5. The component according to claim 1,
wherein the main body comprises a hole extending in the stacking direction from the underside of the main body to the top side of the main body.

6. The component according to claim 1,
wherein the main body comprises a base surface arranged perpendicularly to the stacking direction, said base surface being round.

7. The component according to claim 1,
wherein the main body comprises a base surface arranged perpendicularly to the stacking direction, a side length of said base surface being between 10 and 30 mm.

8. The component according to claim 1,
wherein the main body has a height of between 0.5 and 2.0 mm in the stacking direction.

9. The component according to claim 1,
wherein each of the first and second internal electrodes comprise copper.

10. An arrangement comprising a plurality of components according to claim 1 which are stacked one above another.

11. A component for generating an active haptic feedback, comprising:
a main body having first and second internal electrodes stacked one above another in a stacking direction,
wherein a respective piezoelectric layer is arranged between the first and second internal electrodes,
wherein the component is configured to identify a force exerted on the component, and generate, in response to identification of the force exerted on the component, the active haptic feedback,
wherein the active haptic feedback is generated by virtue of an electrical voltage being applied between the first and second internal electrodes, said electrical voltage resulting in a change in length of the main body,
wherein a metal sheet comprising titanium is arranged on a top side and/or an underside of the main body, and is configured to transform the change in length of the main body in a direction perpendicular to the stacking direction into the change in length of the component in the stacking direction,
wherein the component comprises a measuring unit for measuring a voltage which is generated between the first and second internal electrodes and which arises on account of the force exerted on the component,
wherein the component is configured to identify the force exerted on the component on a basis of the measured voltage,
wherein the component comprises a first external electrode and a second external electrode,
wherein the first internal electrodes are contacted with the first external electrode, and the second internal electrodes are contacted with the second external electrode,
wherein the first and the second internal electrodes have a function to identify the force exerted on the component based on the voltage generated between the first and second internal electrodes, and
wherein the first and the second internal electrodes have a function to initiate the change in length of the component, such that the active haptic feedback is generated, if an AC voltage is applied between the first and the second internal electrodes.

* * * * *